United States Patent
Hong

[19]

[11] Patent Number: 6,133,090
[45] Date of Patent: Oct. 17, 2000

[54] METHOD OF FABRICATING CYLINDRICAL CAPACITOR

[75] Inventor: Gary Hong, Hsinchu, Taiwan

[73] Assignee: United Semiconductor Corp, Hsinchu, Taiwan

[21] Appl. No.: 09/322,051

[22] Filed: May 27, 1999

[51] Int. Cl.[7] .......................... H01L 21/8242; H01L 21/20
[52] U.S. Cl. ........................ 438/254; 428/253; 428/396; 428/397; 428/964
[58] Field of Search ................................... 438/254, 396, 438/397, 253, 964

[56] References Cited

U.S. PATENT DOCUMENTS

| | | | |
|---|---|---|---|
| 5,468,670 | 11/1995 | Ryou ........................................ | 438/396 |
| 5,861,331 | 1/1999 | Chien ...................................... | 438/238 |
| 5,877,052 | 3/1999 | Lin .......................................... | 438/238 |
| 5,902,126 | 2/2000 | Hong et al. ............................. | 438/396 |
| 5,930,621 | 7/1999 | Kang et al. ............................. | 438/253 |
| 6,025,246 | 2/2000 | Kim ........................................ | 438/396 |

*Primary Examiner*—John F. Niebling
*Assistant Examiner*—Jennifer M. Kennedy
*Attorney, Agent, or Firm*—J.C. Patents; Jiawei Huang

[57] ABSTRACT

A method of fabricating a capacitor. A transistor is formed on a substrate. The transistor comprises a gate and a source/drain region. A dielectric layer is formed over the substrate. A covering layer is formed on the dielectric layer. Portions of the covering layer and the dielectric layer are removed to form a contact opening. The contact opening exposes a portion of the source/drain region. A polysilicon layer is formed over the substrate to fill the contact opening. The polysilicon layer is electrically coupled with the source/drain region. A patterned photoresist layer is formed on the polysilicon layer above the contact opening. An anisotropic etching step is performed with the photoresist layer serving as a mask until a portion of the covering layer is exposed. An oxide layer is formed on the exposed covering layer. The surface of the oxide layer is higher than the surface of the polysilicon layer. The photoresist layer is removed to expose a portion of a sidewall of the polysilicon layer. A spacer is formed on the exposed sidewall of the polysilicon layer. An anisotropic etching step is performed with the spacer and the oxide layer serving as masks to remove a portion of the polysilicon layer. The spacer and the oxide layer are removed. A hemispherical grained silicon layer is formed on the polysilicon layer. A dielectric film and a conductive layer are formed over the substrate.

15 Claims, 5 Drawing Sheets

METHOD OF FABRICATING CYLINDRICAL CAPACITOR

BACKGROUND OF THE INVENTION

1. Field of the Invention

The present invention relates to a semiconductor fabrication method. More particularly, the present invention relates to a method of fabricating a capacitor.

2. Description of the Related Art

Memory function of a Dynamic Random Access Memory (DRAM) is carried out by controlling the voltage applied to the source region of a metal oxide semiconductor (MOS) transistor. Applying the voltage to the MOS transistor motivates electrons of a capacitor to flow. In this manner, a read or a write operation is carried out. However, when the capacitor is operated, the electrons in the capacitor are in a non-equilibrium state. In this non-equilibrium state, current leakage easily occurs. Therefore, it is necessary to refresh the capacitor periodically.

The refresh frequency depends on the charge-storage ability of the capacitor. As the storage ability of the capacitor increase, the refresh frequency for the capacitor is decreased. Thus, increasing the storage ability of the capacitor has become a development trend.

There are several methods for increasing the storage capacity of the capacitor. The methods include improving dielectric materiel and conductive material, and increasing the surface area of the capacitor. In order to increase the surface area of the capacitor, it is necessary to perform photolithographic, etching, and deposition steps to form a bottom electrode having a certain shape. The deposition methods that are commonly used are chemical vapor deposition and physical vapor deposition. Typically, those deposition methods must be performed at a high temperature. Unfortunately, the high temperature causes a photoresist layer used in a photolithographic and etching step to decompose and contaminate the platform. Therefore, in semiconductor industry, the photoresist layer must be removed before the deposition step. However, this increases the number of fabrication steps needed to form the predetermined capacitor.

SUMMARY OF THE INVENTION

The invention provides a method of fabricating a capacitor. A transistor is formed on a substrate. The transistor comprises a gate and a source/drain region. A dielectric layer is formed over the substrate. A covering layer is formed on the dielectric layer. Portions of the covering layer and the dielectric layer are removed to form a contact opening. The contact opening exposes a portion of the source/drain region. A polysilicon layer is formed over the substrate to fill the contact opening. The polysilicon layer is electrically coupled with the source/drain region. A patterned photoresist layer is formed on the polysilicon layer above the contact opening. An anisotropic etching step is performed with the photoresist layer serving as a mask until a portion of the covering layer is exposed. An oxide layer is formed on the exposed covering layer by liquid-phase deposition. The surface of the oxide layer is higher than the surface of the polysilicon layer. The photoresist layer is removed to expose a portion of a sidewall of the polysilicon layer. A spacer is formed on the exposed sidewall of the polysilicon layer. An anisotropic etching step is performed with the spacer and the oxide layer serving as masks to remove a portion of the polysilicon layer. The spacer and the oxide layer are removed. A hemispherical grained silicon layer is formed on the remaining polysilicon layer. A dielectric film and a conductive layer are formed over the substrate.

The invention uses the liquid-phase deposition to form the oxide layer. Since the temperature required in the liquid-phase deposition is low, there is no contamination caused by the photoresist layer occurring on the platform. Therefore, the oxide layer can be formed before the step of removing the photoresist layer. The formation of the photoresist layer is advantageous for directly forming the oxide layer with a surface higher than the surface of the polysilicon layer. In this manner, the fabrication steps are simplified. The surface area of the bottom electrode is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
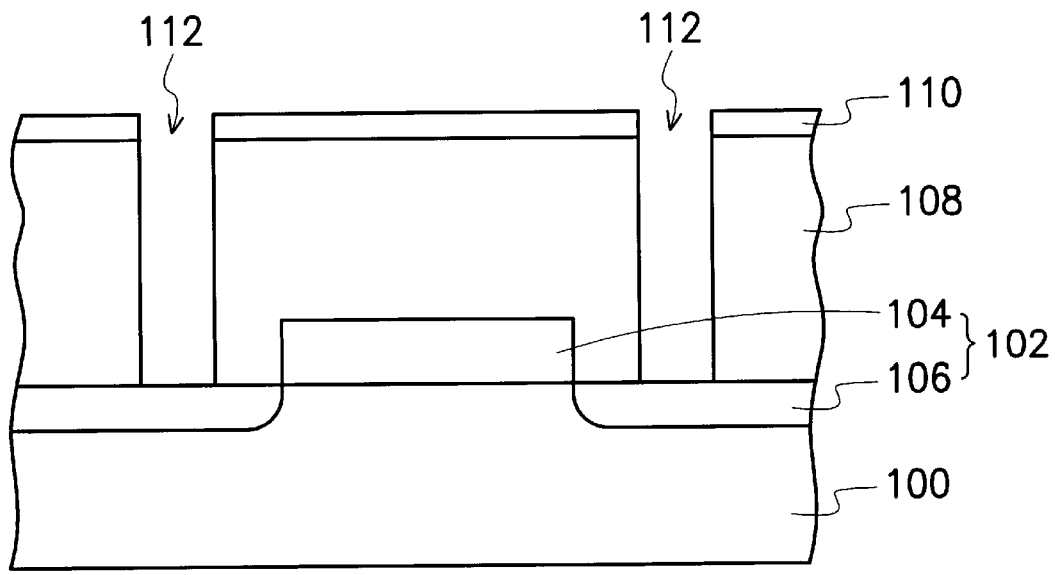
FIGS. 1A through 1G are schematic, cross-sectional views showing a method of fabricating a capacitor according to the first preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In FIG. 1A, a transistor 102 is formed on a substrate 100. The transistor 102 comprises a gate 104 and a source/drain region 106. A dielectric layer 108 is formed over the substrate 100. A covering layer 110 is formed on the dielectric layer 108. The material of the dielectric layer 108 comprises oxide. The material of the covering layer 110 comprises nitride. Portions of the covering layer 110 and the dielectric layer 108 are removed by, for example, anisotropic etching. A contact opening 112 is formed in the covering layer 110 and the dielectric layer 108. The contact opening 112 exposes a portion of the source/drain region 106.

Figure 1B:
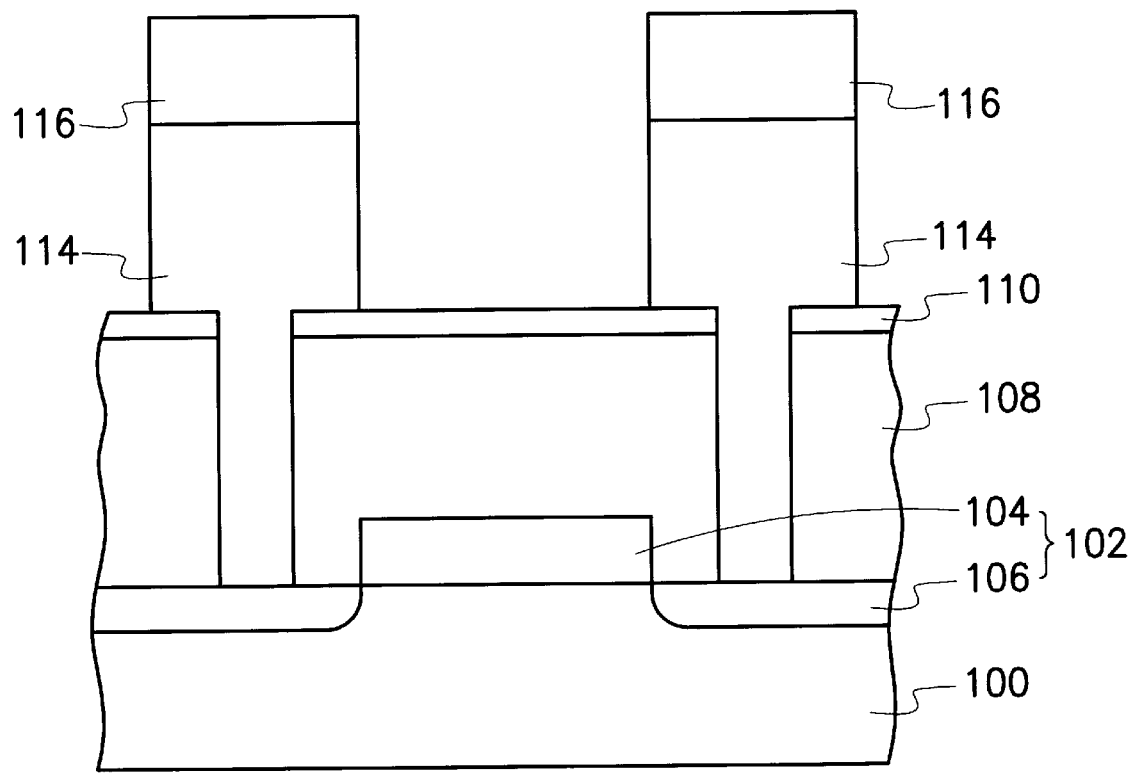

In FIG. 1B, a polysilicon layer 114 is formed over the substrate 100 to fill the contact opening 112. The polysilicon layer 114 can be formed by, for example, chemical vapor deposition. A patterned photoresist layer 116 is formed on the polysilicon layer above the contact opening 112. An anisotropic etching is performed with the photoresist layer 116 serving as mask until a portion of the covering layer 110 is exposed.

Figure 1C:
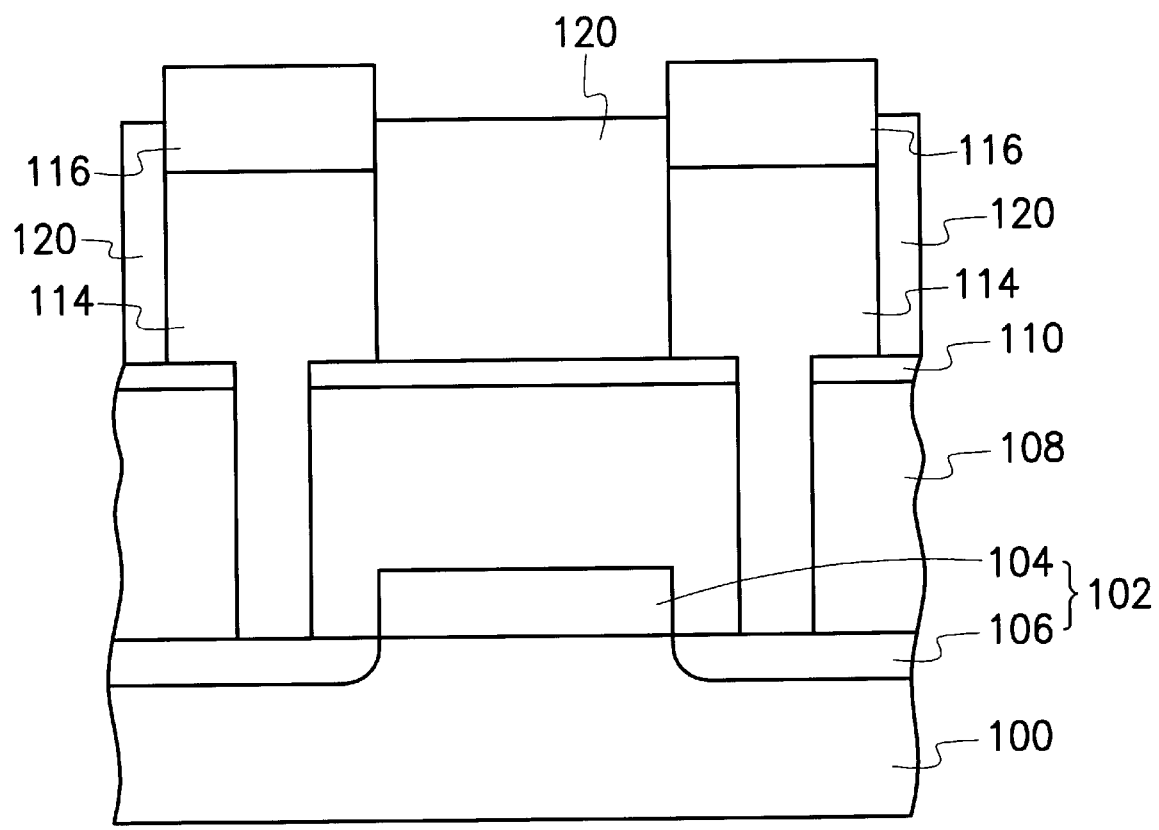

In FIG. 1C, an oxide layer 120 is formed on the exposed covering layer 110. The surface of the oxide layer 120 is higher than the surface of the polysilicon layer 114 and, preferably, below a surface of the photoresist layer 116. The formation of the photoresist layer 116 is advantageous for directly forming the oxide layer 120 with a higher surface than the surface of the polysilicon layer 114. While forming the oxide layer 120, since the photoresist layer 116 is formed on the polysilicon layer 114, the oxide layer 120 is directly deposited on the exposed covering layer 110 to a certain thickness. Thus, the fabrication steps are simplified. The oxide layer 120 is preferably formed by liquid-phase deposition. As a result, the photoresist does not contaminate platforms at the temperature of the liquid-phase deposition. As the oxide layer 120 is formed by liquid-phase deposition, the oxide layer 120 tends to flow to a lower surface, that is, a surface of the exposed covering layer 110 between the polysilicon layer 114 instead of being formed over the polysilicon layer 114 as shown in FIG. 1C. Thus, the oxide layer 120 can be formed without removing the photoresist layer 116.

Figure 1D:
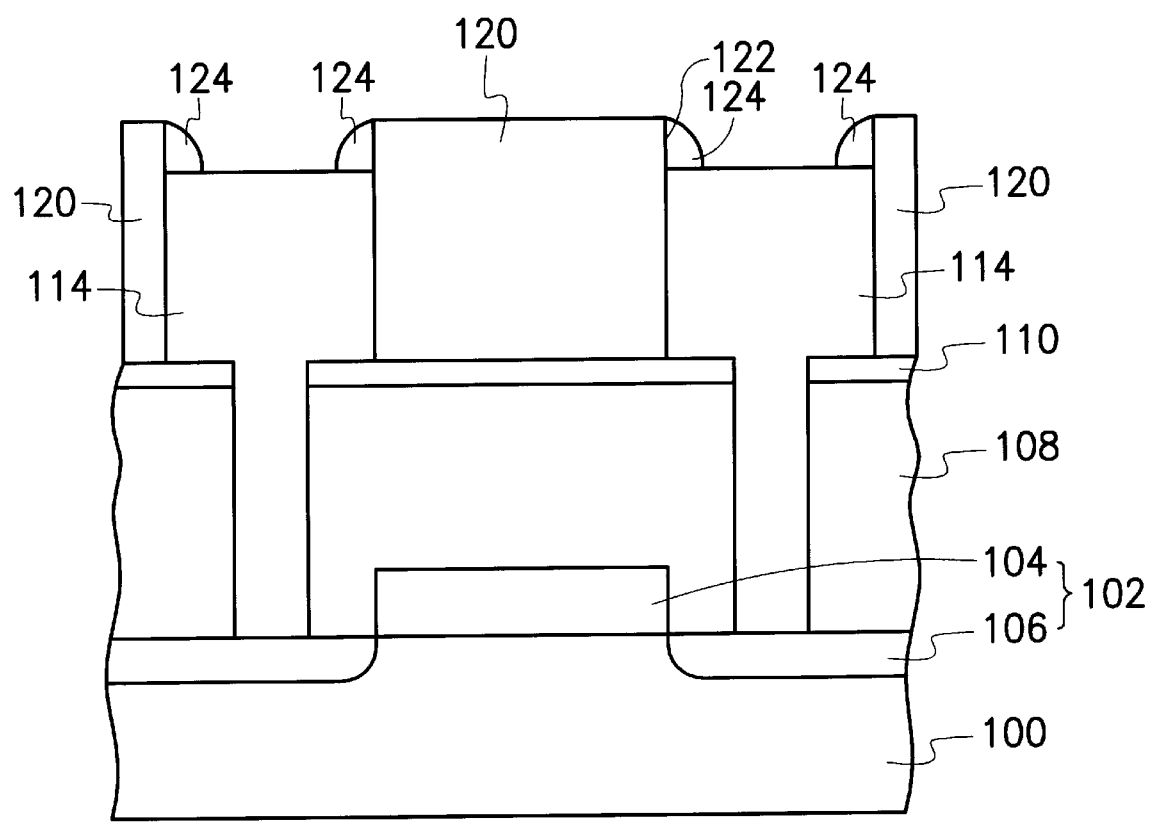

In FIG. 1D, the photoresist layer 116 is removed to expose a portion of a sidewall 122 of the oxide layer 120. A spacer 124 is formed on the exposed sidewall 122 of the oxide layer 120. As the oxide layer 120 is formed by liquid-phase deposition, the oxide layer 120 tends to flow to a lower surface, that is, a surface of the exposed covering layer 110 between the polysilicon layer 114 instead of being formed over the polysilicon layer 114 as shown in FIG. 1C. The material of the spacer 124 comprises nitride. The spacer 124 can be formed by forming a nitride layer (not shown) on the oxide layer 120 and the polysilicon layer 114, and then performing an etching back step.

Figure 1E:
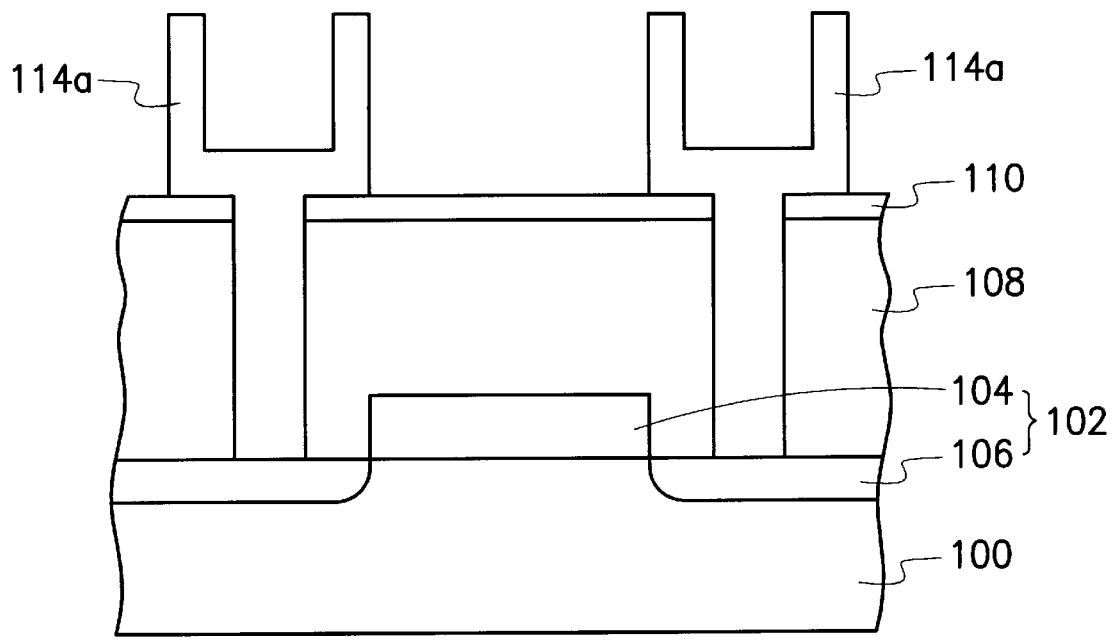

In FIG. 1E, an anisotropic etching step is performed with the oxide layer 120 and the spacer 124 serving as masks. A portion of the polysilicon layer 114 is removed, so as to form a cylindrical bottom electrode 114a. The spacer 124 and the oxide layer 120 are removed by, for example, wet etching.

Figure 1F:
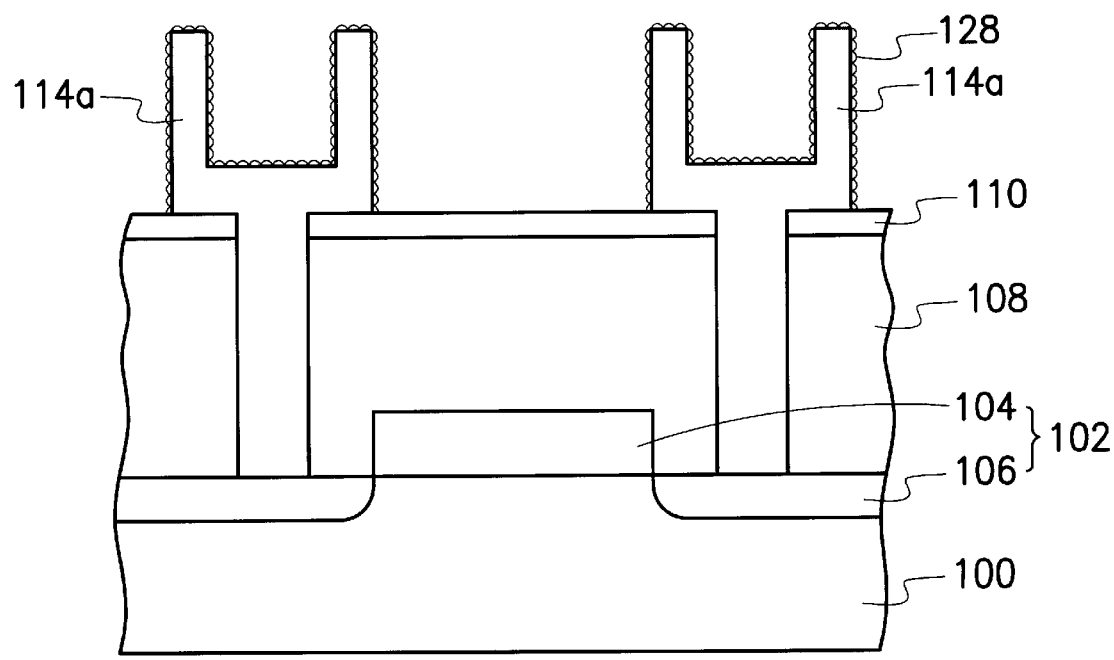

In FIG. 1F, a hemispherical grained silicon (HSG-Si) layer 128 is formed on the cylindrical bottom electrode 114a. The HSG-Si layer 128 can be formed by, for example, eroding the polysilicon layer 114 with a HF solution and then performing a thermal step. Since there is no HSG-Si layer 128 formed on the covering layer, the above-described HSG-Si layer 128 is called a selective HSG-Si layer.

Figure 1G:
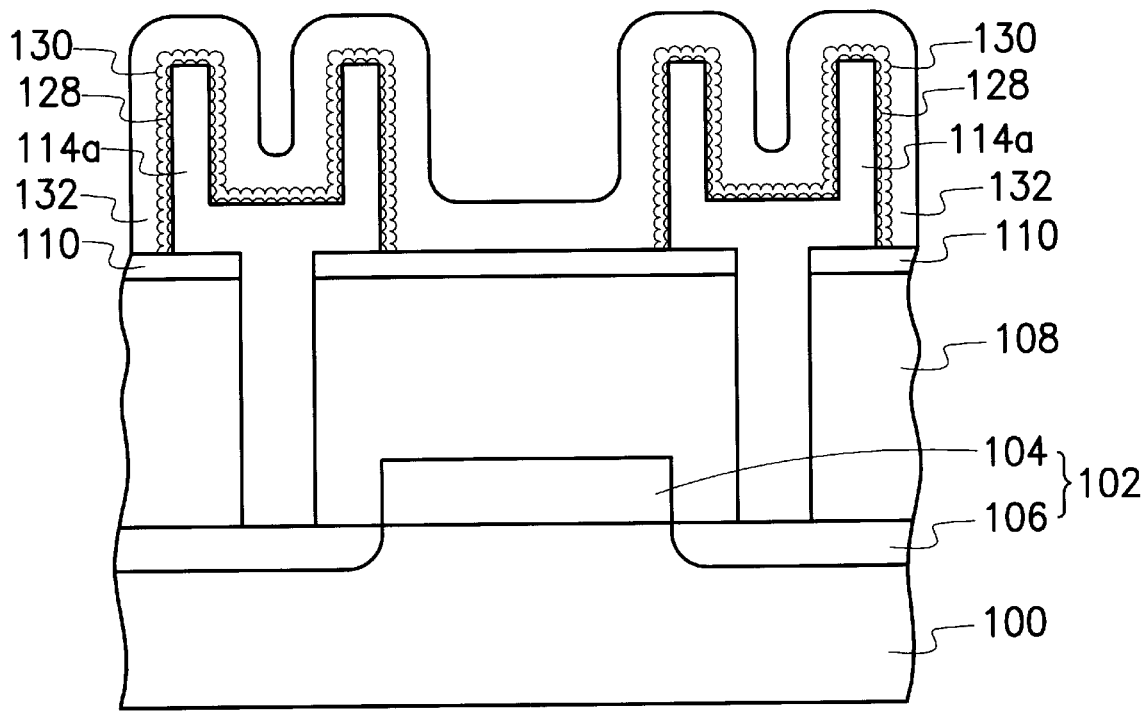

In FIG. 1G, a dielectric film 130 is formed on the HSG-Si layer 128. A conductive layer 132 is formed over the substrate 100. The dielectric film 130 comprises a silicon oxide layer, a silicon nitride/silicon oxide (NO) layer, a silicon oxide/silicon nitride/silicon oxide (ONO) layer, a $Ta_2O_5$ layer or other layer with a high dielectric constant. The material of the conductive layer 132 comprises polysilicon. The conductive layer 132 is used as a top electrode of the capacitor.

The invention uses the liquid-phase deposition to form the oxide layer 120. Since the temperature required in the liquid-phase deposition is low, there is no platform contamination caused by the photoresist layer 116. Therefore, the oxide layer 120 can be formed before the step of removing the photoresist layer 116. The formation of the photoresist layer 116 is advantageous for directly forming the oxide layer 120 having a higher surface than the surface of the polysilicon layer 114. In this manner, the fabrication steps are simplified. The surface area of the bottom electrode is increased.

It will be apparent to those skilled in the art that various modifications and variations can be made to the structure and the method of the present invention without departing from the scope or spirit of the invention. In view of the foregoing, it is intended that the present invention cover modification and variation of this invention provided they fall within the scope of the following claims and their equivalents.

What is claimed is:

1. A method of fabricating a cylindrical capacitor, the method comprising the steps of:

forming a transistor on a substrate, wherein the transistor comprises a gate and a source/drain region;

forming a dielectric layer on the substrate to cover the transistor;

forming a covering layer on the dielectric layer;

forming a contact opening in the dielectric layer to expose the source/drain region;

forming a polysilicon layer on the covering layer to fill the contact opening;

forming a patterned photoresist layer on the polysilicon layer above the contact opening;

removing a portion of the polysilicon layer with the photoresist layer serving as a mask until the covering layer is exposed;

forming an oxide layer on the exposed covering layer without being over the polysilicon layer, wherein a surface of the oxide layer is higher than a surface of the polysilicon layer;

removing the photoresist layer to expose the polysilicon layer and a sidewall of the oxide layer;

forming a spacer on the exposed sidewall of the oxide layer, so that an edge portion of the polysilicon layer is covered by the spacer;

removing the exposed polysilicon layer with the spacer and the oxide layer serving as masks;

removing the spacer and the oxide layer;

forming a hemispherical grained silicon layer on the remaining polysilicon layer;

forming a dielectric film on the hemispherical grained silicon layer; and forming a conductive layer over the substrate.

2. The method of claim 1, wherein the step of forming the oxide layer comprises liquid-phase deposition.

3. The method of claim 1, wherein the step of forming the contact opening comprises anisotropic etching.

4. The method of claim 1, wherein the step of forming the polysilicon layer comprises chemical vapor deposition.

5. The method of claim 1, wherein a material of the spacer comprises nitride.

6. The method of claim 1, wherein the step of forming the spacer comprises:

forming a nitride layer to cover the polysilicon layer and the oxide layer; and etching back the nitride layer.

7. The method of claim 1, wherein the step of removing the oxide layer comprises wet etching.

8. The method of claim 1, wherein the step of forming the hemispherical grained silicon layer comprises:

eroding the surface of the polysilicon layer with a HF solution; and performing a thermal step.

9. A method of fabricating a bottom electrode of a capacitor, comprising the steps of:

forming a covering layer over a substrate;

forming polysilicon layer over a substrate after forming the covering layer;

forming a patterned photoresist layer to cover a portion the polysilicon layer;

performing a first anisotropic etching step on the exposed polysilicon layer with the photoresist layer as a mask until a portion of the covering layer is exposed, forming an oxide layer on the exposed covering layer to encompass the remaining polysilicon layer, wherein the surface of the oxide layer is higher than the surface of the remaining polysilicon layer;

removing the photoresist layer to expose a sidewall of the oxide layer and the surface of the polysilicon layer;

forming a spacer on sidewall of the oxide layer over an edge portion of the polysilicon layer;

performing a second anisotropic etching with the oxide layer and the spacer serving as masks to remove the exposed polysilicon layer; and removing the oxide layer.

10. The method of claim 9, wherein the step of forming the oxide layer comprises liquid-phase deposition.

11. The method of claim 9, wherein the step of forming the polysilicon layer comprises chemical vapor deposition.

12. The method of claim 9, wherein a material of the spacer comprises nitride.

13. The method of claim 12, wherein the step of forming the spacer comprises:

forming a nitride layer to cover the polysilicon layer and the oxide layer; and etching back the nitride layer.

14. The method of claim 9, wherein the step of removing the oxide layer comprises wet etching.

15. A method of forming a capacitor, comprising:

forming a dielectric layer on a substrate and a covering layer on the dielectric layer;

forming a contact window penetrating through the covering layer and the dielectric layer to expose portions of the substrate;

forming a polysilicon layer to fill the contact window, wherein the polysilicon layer overfills to cover the covering layer;

patterning the polysilicon layer, so that a portion of the underlying covering layer is exposed;

forming an oxide layer on the exposed covering layer surrounding the bottom electrode layer, the oxide layer having a surface higher than a surface of the patterned polysilicon layer;

forming a spacer on a sidewall of the oxide layer over an edge portion of the polysilicon layer;

patterning the polysilicon layer with the spacer as a mask, so that a cylindrical polysilicon layer is formed;

removing the oxide layer;

forming a hemispherical grain silicon layer along a surface profile of the cylindrical polysilicon layer;

forming a dielectric layer on the hemispherical grain silicon layer; and forming a conductive layer on the dielectric layer.

* * * * *